US006482665B1

(12) United States Patent
Chu et al.

(10) Patent No.: US 6,482,665 B1
(45) Date of Patent: Nov. 19, 2002

(54) POLARIZATION SWITCHING SURFACE-EMITTING LASER AND A METHOD OF MANUFACTURING THE SAME

(75) Inventors: Hye Yong Chu, Daejon-Shi (KR); Byueng-Su Yoo, Daejon-Shi (KR); Hyo-Hoon Park, Daejon-Shi (KR)

(73) Assignee: Electronics and Telecommunications Research Institute, Daijon-Shi (KR)

( * ) Notice: Subject to any disclaimer, the term of this patent is extended or adjusted under 35 U.S.C. 154(b) by 26 days.

(21) Appl. No.: 09/718,188

(22) Filed: Nov. 21, 2000

Related U.S. Application Data

(62) Division of application No. 09/143,076, filed on Aug. 28, 1998, now abandoned.

(30) Foreign Application Priority Data

Sep. 12, 1997 (KR) ............................................. 97-47183

(51) Int. Cl.⁷ ............................................... H01L 21/00
(52) U.S. Cl. .............................. 438/32; 438/46; 372/46
(58) Field of Search ............................. 438/32, 39, 46, 438/29; 372/46, 49

(56) References Cited

U.S. PATENT DOCUMENTS 5,345,462 A   9/1994   Choquette .................... 372/45
5,394,423 A   2/1995   Kasahara ..................... 372/45

OTHER PUBLICATIONS

Toshikazu Mukaihara, "Polarization Control of Vertical Cavity Surface–Emitting Lasers Using Birefringent Meral/Dielectric Polarizer Loaded on Top Distributed Bragg Reflector", 1995, pp. 667–673.
A Chavez–Pirson et al., "Polarization Properties of a Vertical Cavity Surface Emitting Laser Using A Fractional Laser Superlattice Gain Medium", 1993, pp. 3082–3084.

*Primary Examiner*—Richard Elms
*Assistant Examiner*—Beth E. Owens
(74) *Attorney, Agent, or Firm*—Cohen, Pontani, Lieberman & Pavane

(57) ABSTRACT

A method of manufacturing a polarization switching surface-emitting laser in which a laser resonance wavelength depends on changing the polarization of the laser, by changing the refractivity of a compound semiconductor mirror layer of the laser depending on polarizations using an electro-optic effect of compound semiconductor materials such as GsAs and applying an electric field thereto.

5 Claims, 4 Drawing Sheets

POLARIZATION SWITCHING SURFACE-EMITTING LASER AND A METHOD OF MANUFACTURING THE SAME

CROSS-REFERENCE TO RELATED APPLICATION(S)

This application is a Divisional of U.S. patent application Ser. No. 09/143,076, filed Aug. 28, 1998 now abandon.

FIELD OF THE INVENTION

The present invention relates to a method of manufacturing a polarization surface-emitting laser, and, more particularly, to such a manufacturing method which includes changing the refractivity of a compound semiconductor mirror layer of a surface-emitting laser depending on its polarization, using the electro-optic effect of compound semiconductor materials such as GaAs and applying an electric field thereto.

DESCRIPTION OF THE PRIOR ART

Currently, surface-emitting lasers are being studied for their effective coupling with optical fibers and simple 2-dimensional (2-D) array manufacturing, in the fields of optical communications and optical information processing. For such applications of surface-emitting lasers, polarized switching is desirable since switching at high speed is possible without non-linear effects such as chirping, because such applications have stable polarization features and are performed at the state when state change, such as carrier density, in minimized in resonators.

Also, conventional polarization control methods of surface-emitting lasers include a structure which includes an asymmetrical transverse resonator having asymmetrical stress, a birefringent polarization plate and which uses quantum gain materials. However, known methods can not actively convert all the polarization of oscillating beams, due to the nature of fixed polarization in each polarizing element, and therefore only partially improves polarization.

FIG. 1 is a cross sectional view of a vertical structure of a known surface-emitting laser substrate, and may be described as follows.

A bottom mirror layer 2 is formed on a semiconductor substrate 1, and an active layer 3 is formed on bottom mirror layer 2. A top mirror layer 4 is formed on active layer 3. As the surface-emitting laser of such structure has a symmetrical structure on its light emitting surface, it will not allow polarization of the emitted light, but instead shows polarization by asymmetry generated in the process, stress effect and electric field effect for current injection. However, as these effects occur naturally, i.e. under normal operation of the lasers, and are not uniform, the problem of showing a change in polarization for each element and each output exists.

SUMMARY OF THE INVENTION

Accordingly, the present invention is directed to a method of manufacturing a substrate for surface-emitting lasers, which can control polarizations artificially and actively, by overcoming non-uniform polarization features for each element and non-uniform output generated due to an asymmetry of process, stress asymmetry and electric field effect.

To achieve the above object, polarization switching surface-emitting lasers according to the present invention have a bottom mirror layer and an active layer successively formed on top of a semiconductor substrate. A first top mirror layer of a double layer of AlAs and GaAs is formed as a column in an established and selected area on top of the active layer. An insulation area is formed at an established depth on the exposed side of the AlAs layer and second and third top mirror layers are formed as a column in a selected area of the first top mirror layer. A first n-type electrode is formed on the back of a semiconductor substrate and a p-type electrode is formed in the selected area on top of the first top mirror layer. A second n-type electrode is formed on top of the third top mirror layer. The laser is operated by applying currents between the first n-type electrode and the p-type electrode; and switching polarization by applying an electric field to the second n-type electrode formed on top of the third top mirror layer.

The manufacturing method of a polarization surface-emitting laser according to the present invention includes successively forming a bottom mirror layer and an active layer on top of a semiconductor substrate. Then, a first top mirror layer of a structure of an AlAs layer/a GaAs layer is formed on top of the active layer; and a second top mirror layer of a multi-layer structure of a distributed Bragg reflector is formed with no doping so that a high electric field may be applied to the top of the first top mirror layer thereby resulting in high reflectance. A third top mirror layer of a multi-layer structure of a distributed Bragg reflector with n-type doping so that an electric field may be efficiently distributed is formed on top of the second top mirror layer. A bottom n-type electrode is formed in the exposed area of the semiconductor substrate after coating an anti-reflection film on the back surface of the semiconductor substrate and selectively etching a part of an edge of the anti-reflection film. A laser column is formed by etching the third top mirror layer, the second mirror layer and a part of the GaAs layer of the first top mirror layer by ion beam etching after forming a photoresist pattern on the top surface of the third top mirror layer. A protective film is formed using SiNx on the entire structure including the laser column. The protective film and the first top mirror layer are etched after forming a photoresist pattern so that the laser column may be formed in the center of the device. An insulation area is formed by oxidizing the exposed AlAs layer on the side of the etched first top mirror layer by wet oxidation. A part of the protective film on top of the GaAs layer of the protective film on top of the GaAs layer of the first top mirror layer is removed, and a p-type electrode is formed on the exposed GaAs layer. The protective film on top of the laser column is then removed to form an n-type electrode on top of the exposed laser column. An insulation film is formed using SiOx or SiNx on top of the entire structure, and an electrode pad for wire bonding is formed after etching a part of the insulation film on top of the n-type electrode and the insulation film on top of the p-type electrode.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

The accompanying drawings, which are included to provide a further understanding of the invention and are incorporate in and constitute a part of this application, illustrate embodiments of the invention and together with the description serve to explain the principles of the invention.

DETAILED DESCRIPTION OF THE PREFERRED EMBODIMENTS

Materials, such as GaAs in semiconductor materials, lack inversion symmetry due to electro-optic effect, that is, their refractivity changes when an electric field is applied. If an electric field (Eo) is applied to the x direction in a zinc blend crystal structure, to which a Group III–V compound semiconductor, such as GaAs, belongs, refractivity changes as a function of the polarization direction according to the following relationship:

$$N_x = E_0 - N_0 3_r E_0/2$$

$$N_x = N_0 + N_0 3_r E_0/2$$

$$N_z = N_0$$

Wherein, $N_0$ is a refractivity before applying an electric field, and the principal axes x and y are given to the direction of 110 and 110 respectively. As a result, if an electric field is applied to the Distributed Bragg Reflector (DBR) of a compound semiconductor to make a mirror layer of the surface-emitting laser, each different laser resonance wavelength appears depending on two degrees of polarization as each vertical direction of 110 and 110 becomes a principal axis and each has different refractivity, as shown in Equation 1. Accordingly, polarization gains of the gain layer are large in an active layer and which has a wavelength of small mirror loss as only a resonance wavelength is oscillated, oscillation of the polarization which is vertical to it is restrained. If the direction of an electric field changes to the opposite direction, the other polarization is oscillated as the direction of the refractivity changes into the opposite direction. Therefore, polarization of oscillating beams may change actively by changing the strength and direction of an applied electric field.

Reference will now be made in detail to the preferred embodiments of the present invention, and examples of which are illustrated in the accompanying drawings.

FIGS. 2A through 2I show successive cross sectional views of a polarization surface-emitting laser 10 as it is manufactured according to the present invention.

Figure 1:
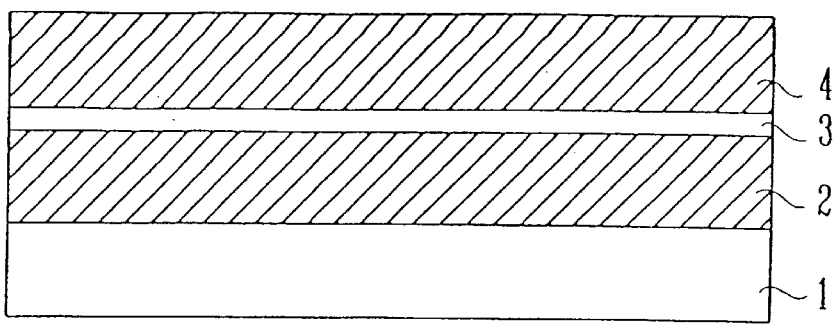
FIG. 1 shows a cross sectional view to describe a vertical structure of a prior art surface-emitting laser.
Figure 2A:
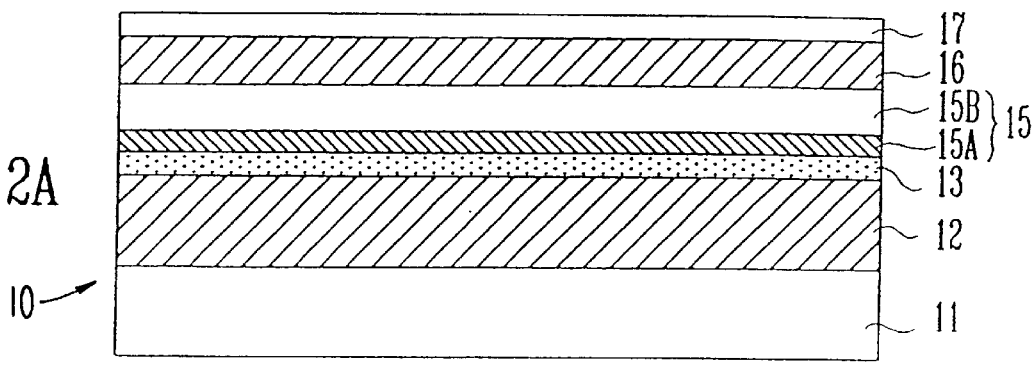
FIGS. 2A through 2I show cross sectional views of a polarization switching surface-emitting laser manufactured according to the present invention during the steps of the manufacturing process.

FIG. 2A is a cross sectional view of a structure of a substrate for forming a surface-emitting laser 10. A bottom mirror layer 12 is formed on top of a semiconductor substrate 11, and an active layer 13 is formed on top of bottom mirror layer 12. A first top mirror layer 15 is also formed on top of active layer 13, and a second mirror layer 16 is formed on top of first top mirror layer 15. Then a third mirror layer 17 is formed on top of second top mirror layer 16.

First top mirror layer 15 comprises a compound semiconductor of AlAs 15A/GaAs 15B of p-type doping to define a current injection path formed via wet oxidation. The refractivity of second top mirror layer 16 changes depending on the strength and direction of an applied electric field. Second top mirror layer 16 comprises a DBR multi-layer structure by grown compound semiconductors in turn such as AlAs/AlGaAs or AlAs/GaAs with high purity and no doping so that a high amplitude field may be applied thereto, resulting in high reflectance. Third top mirror layer 17, located under the n-type electrode, comprises a DBR multi-layer structure made of compound semiconductor such as AlAs/AlGaAs or AlAs/GaAs of n-type doping with each $\lambda/4n$ thickness in turn for efficient electric field distribution.

Figure 2B:
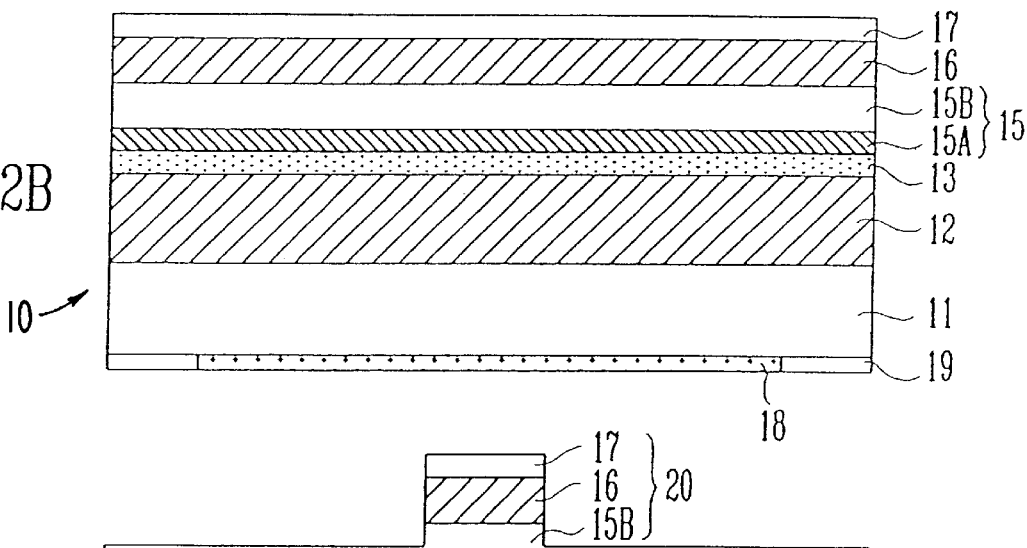

FIG. 2B shows a cross sectional view of a bottom n-type electrode 19 and an anti-reflecting film 18 which are added on the back of the semiconductor substrate 11 and after an anti-reflecting film 18 is selectively etched on the edge of semiconductor substrate 11.

Figure 2C:
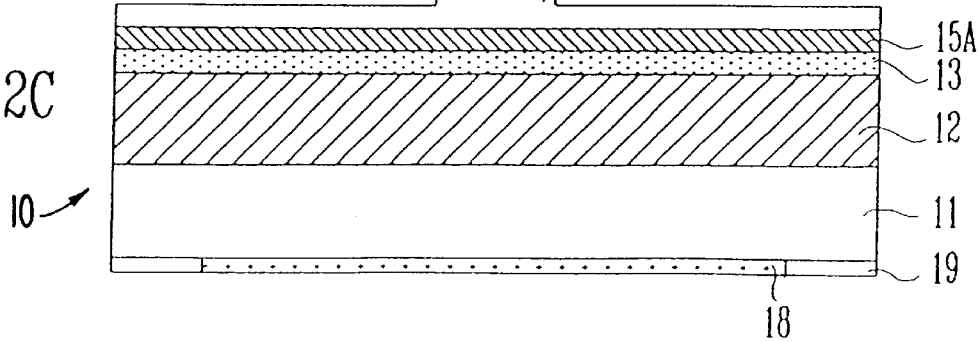
Figure 2D:
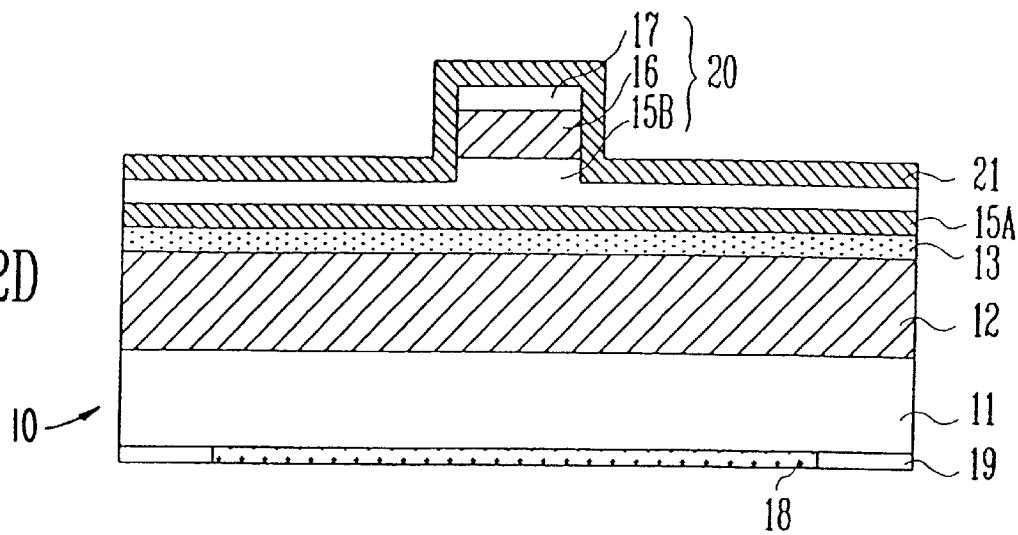

FIG. 2C shows a cross sectional view of laser 10 after a laser column 20 is formed by a patterning process via dry etching for third top mirror layer 17, second top mirror layer 16 and a part of GaAs layer 15B on first top mirror layer 15 after forming a photoresist pattern (not shown) on the top surface of the above semiconductor substrate 11 for an etching mask.

Figure 2E:
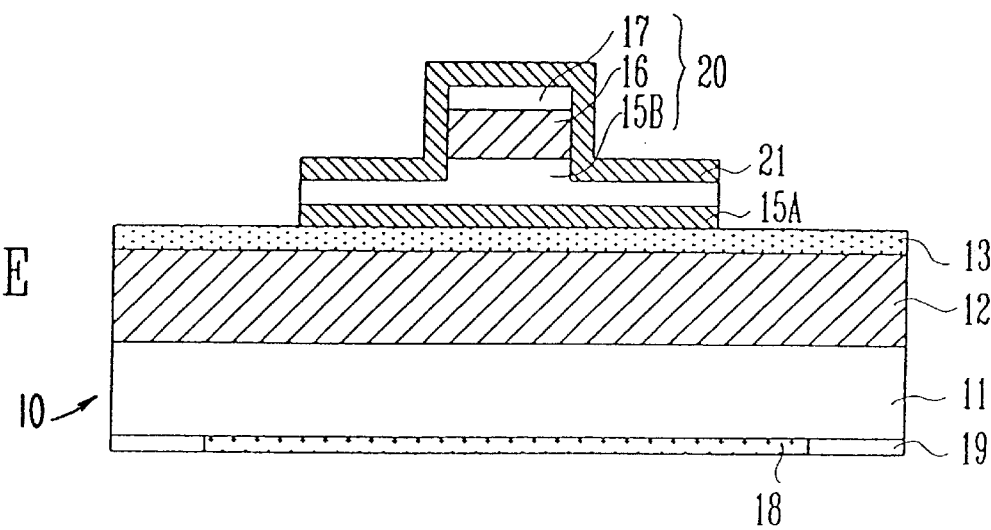

FIG. 2E shows a cross sectional view of laser 10, following a dry etching of protective film 21 and first top mirror layer 15 so that active layer 13 is exposed, after forming a photoresist pattern so that laser column 20 may be formed in the center of laser 10.

Figure 2F:
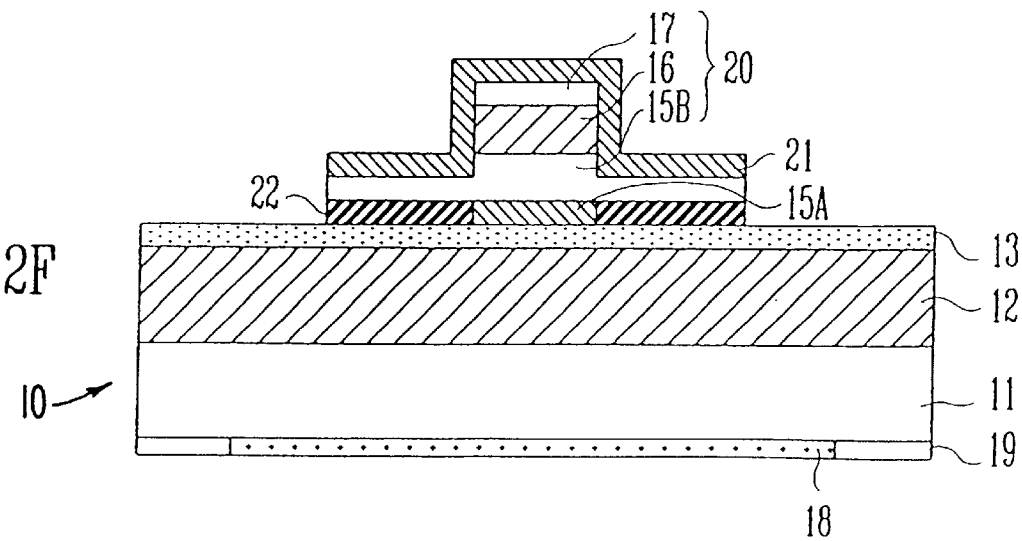

FIG. 2F shows a cross sectional view of laser 10, isolating elements and defining a current injection path by forming an insulation area 22 using wet oxidation for the AlAs layer in a first top mirror layer 15 whose side is exposed by etching.

Figure 2G:
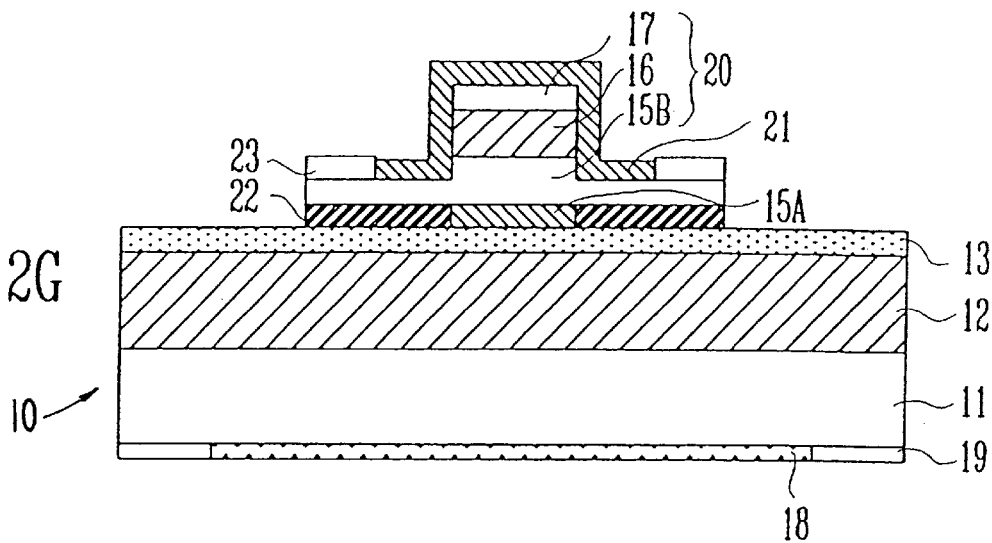

FIG. 2G shows a cross section of laser 10, after a p-type electrode 23 is formed by the lift-off method after applying a photoresist on the whole surface of the substrate top and after selectively etching protective film 21 by forming a photoresist pattern in a ring shape on the top of the first top mirror layer 15.

Figure 2H:
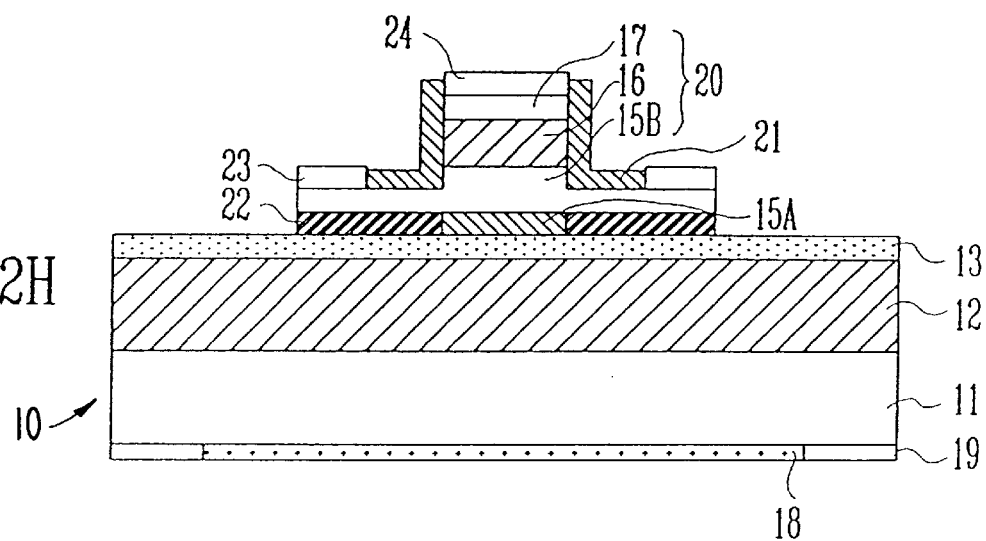

FIG. 2H shows a cross section of laser 10, after a top n-type electrode 24 is formed by the lift-off method after a photoresist is applied to the whole surface of the substrate top and after etching protective film 21 by patterning a photoresist on third mirror layer 17.

Figure 2I:
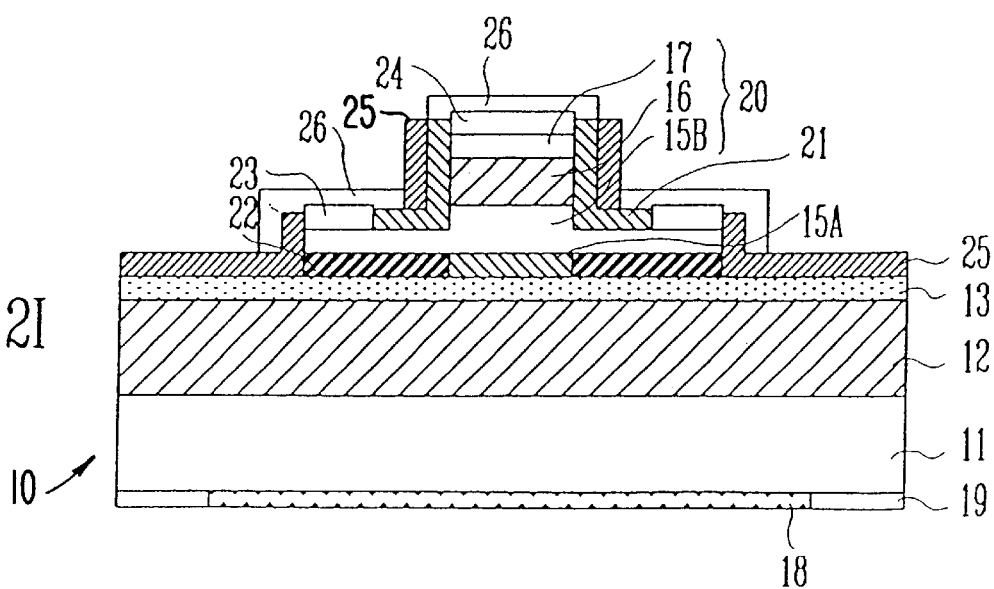

FIG. 2I shows a cross sectional view of laser 10 after an electrode pad 26 is formed by the lift-off method for wire bonding after an insulation film 25 of SiOx or SiNx is formed on the whole surface of the substrate top and selected areas of the top insulation film of the n-type electrode 24 and the p-type electrode 23 are etched.

Figure 3:
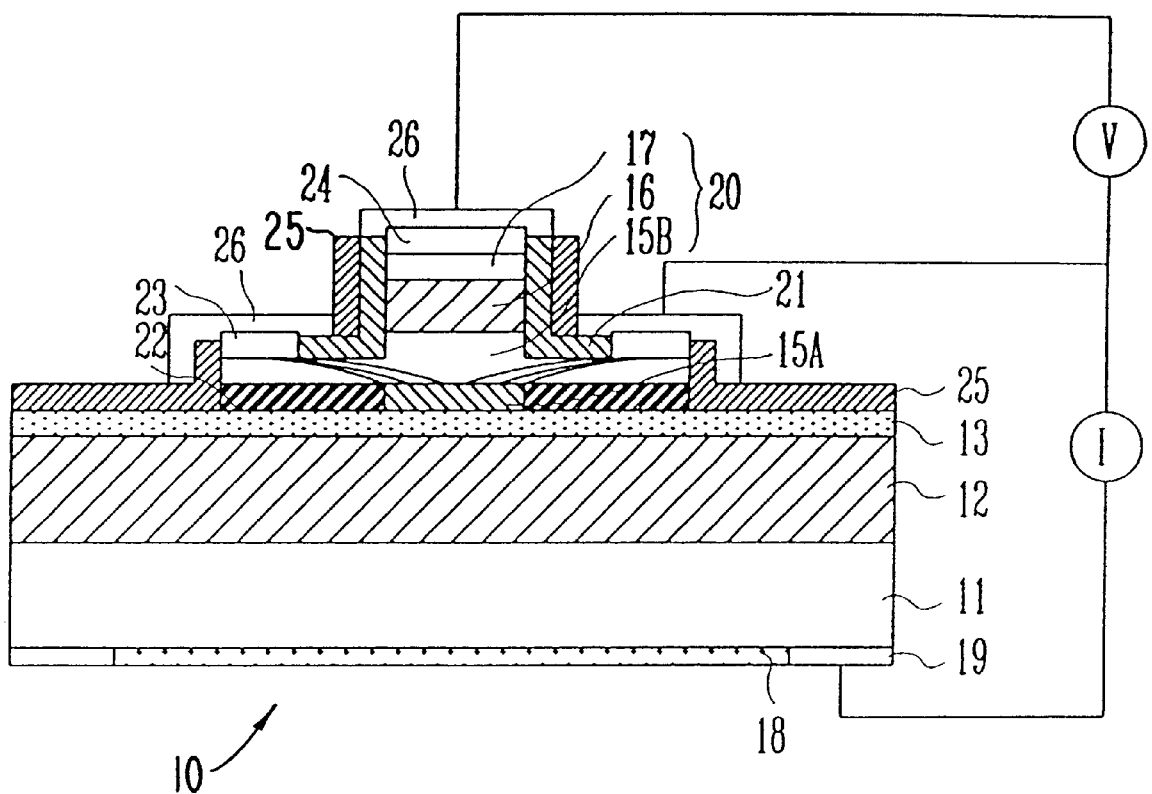
FIG. 3 shows a cross sectional view of a completed polarization switching surface-emitting laser according to the present invention.

A polarization switching surface-emitting laser 10 thus manufactured by the above method, as shown in FIG. 3, oscillates lasers by applying a current (I) between the bottom n-type electrode and the p-type electrode and then injecting electrons and holes to the active layer. If a resonance wavelength of the top mirror layer changes depending on polarization by applying an electric field of voltage (V) to the top n-type electrode, the light, whose gains are large and which has polarization to the direction of the resonance wavelength with less mirror loss, oscillates. Accordingly, features of polarization may be adjusted depending on adjusting direction and amplitude of voltage (V). As a result, two orthogonal polarizations may be actively adjusted and switching [of super high speed] is possible with high speed without changing oscillation features, as polarization adjustment may be performed without changing the distribution of carriers.

As described above, polarization may be actively adjusted in two orthogonal directions respectively, and this method shows excellent effect as a core element which can be used in optical switching and optical computers while permitting polarization switching with high speed.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a polarization surface-emitting laser, comprising:

forming a bottom mirror layer and an active layer on top of a semiconductor substrate in succession;

forming a first top mirror layer of a structure of an AlAs layer/GaAs layer on top of said active layer;

forming a second top mirror layer of a multi-layer structure of a Distributed Bragg Reflector with no doping so that a high electric field may be applied to a top of said first top mirror layer and high reflectance may be obtained;

forming a third top mirror layer of a multi-layer structure of a Distributed Bragg Reflector with n-type doping so that an electric field may be efficiently distributed on top of said second top mirror layer;

forming a bottom n-type electrode in an etched area of said semiconductor substrate after adding an anti-reflection film on a back surface of said semiconductor substrate and selectively etching a part of said anti-reflection film;

forming a photoresist pattern on a top surface of said third top mirror layer;

forming a laser column by etching said third top mirror layer, said second mirror layer and a part of said GaAs layer of said first top mirror layer by ion beam etching;

forming a protective film of SiNx on said laser;

etching said protective film and said first top mirror layer after forming a photoresist pattern so that said laser column may be formed in the center thereof;

forming an insulation area by oxidizing a part of an exposed portion of said AlAs layer on a side of said first top mirror layer by wet oxidation;

removing a part of said protective film on top of said GaAs layer of said first top mirror layer to form a p-type electrode on said exposed GaAs layer;

removing said protective film on top of said laser, thereby exposing said laser column to form a top n-type electrode on top of said exposed laser column;

forming an insulation film of one of the group consisting essentially of SiOx and SiNx on top of said laser; and forming an electrode pad for wire bonding after etching said insulation film on top of said n-type electrode of said third top mirror layer and a part of said insulation film on top of said p-type electrode.

2. The method of manufacturing a polarization surface-emitting laser, as recited in claim 1, wherein said first top mirror layer performs p-type doping for effective injection of holes to said active layer and comprises compound semiconductors of AlAs/GaAs for defining a current injection path by wet oxidation.

3. The method of manufacturing a polarization surface-emitting laser, as recited in claim 1, wherein said second top mirror layer comprises a multi-layer structure of a Distributed Bragg Reflector comprising semiconductors of one of the group consisting essentially of AlAs/AlGaAs or AlAs/GaAs with high purity and no doping, for maximum refractivity change and high reflectance, that are grown in turn by applying a high electric field.

4. The method of manufacturing a polarization surface-emitting laser, as recited in claim 1, wherein said third top mirror layer comprises a multi-layer structure of semiconductors of one of the group consisting essentially of AlAs/AlGaAs or AlAs/GaAs of n-type doping with each $\lambda/4n$ thickness in turn for efficient electric field distribution, such that a refractivity of said third top mirror layer changes as a function of a strength of an electric field applied to said n-type electrode, thereby causing a polarization direction of an oscillating beam to change.

5. The method of manufacturing a polarization surface-emitting laser, as recited in claim 2, wherein element isolation and current injection paths are defined by wet oxidation after exposing a side of said AlAs layer of said first top mirror layer by dry etching.

* * * * *